United States Patent [19]

Yamamoto et al.

[11] Patent Number: 4,755,257

[45] Date of Patent: Jul. 5, 1988

[54] METHOD OF PROCESSING THIN METAL SHEETS BY PHOTOETCHING

[75] Inventors: Toshio Yamamoto; Masaru Kawasaki; Takefumi Kandori; Ryoichi Ando, all of Shiga, Japan

[73] Assignee: Dainippon Screen Mfg. Co., Ltd., Japan

[21] Appl. No.: 35,050

[22] Filed: Apr. 6, 1987

[30] Foreign Application Priority Data

Apr. 17, 1986 [JP] Japan .................................. 61-89563

[51] Int. Cl.$^4$ ............................ C23F 1/02; B44C 1/22
[52] U.S. Cl. .................................. 156/631; 156/634; 156/640; 156/644; 156/656; 156/659.1; 156/661.1; 156/233; 156/247; 430/23; 430/312; 430/318
[58] Field of Search ............... 156/630, 631, 634, 640, 156/644, 656, 659.1, 661.1, 233, 247, 249; 430/23, 312, 313, 318, 321, 323

[56] References Cited

U.S. PATENT DOCUMENTS 3,506,507 4/1970 Brietzke .............................. 156/631
3,960,561 6/1976 Haining et al. ................. 156/631 X
4,155,801 5/1979 Provancher ..................... 156/644 X
4,341,591 7/1982 Tamutus .......................... 156/640 X

FOREIGN PATENT DOCUMENTS 0126971 8/1982 Japan .................................. 156/631

Primary Examiner—William A. Powell
Attorney, Agent, or Firm—Ostrolenk, Faber, Gerb & Soffen

[57] ABSTRACT

A photoetching method for processing a thin metal sheet to produce apertured shadow masks. The disclosed method utilizes a supporting layer for supporting a metal sheet. A photoresist layer is formed on the metal sheet for defining pattern images. An etching solution is supplied to metal sheet surfaces exposed through voids of the photoresist layer defining the pattern images to etch the metal surfaces. Then the photoresist layer is removed from the metal sheet, and the metal sheet is removed from the supporting sheet. The resulting metal sheet constitutes a shadow mask having a multiplicity of apertures. Productivity may be doubled by applying two metal sheets to opposite faces of the supporting sheet, respectively, and processing both metal sheets simultaneously.

4 Claims, 2 Drawing Sheets

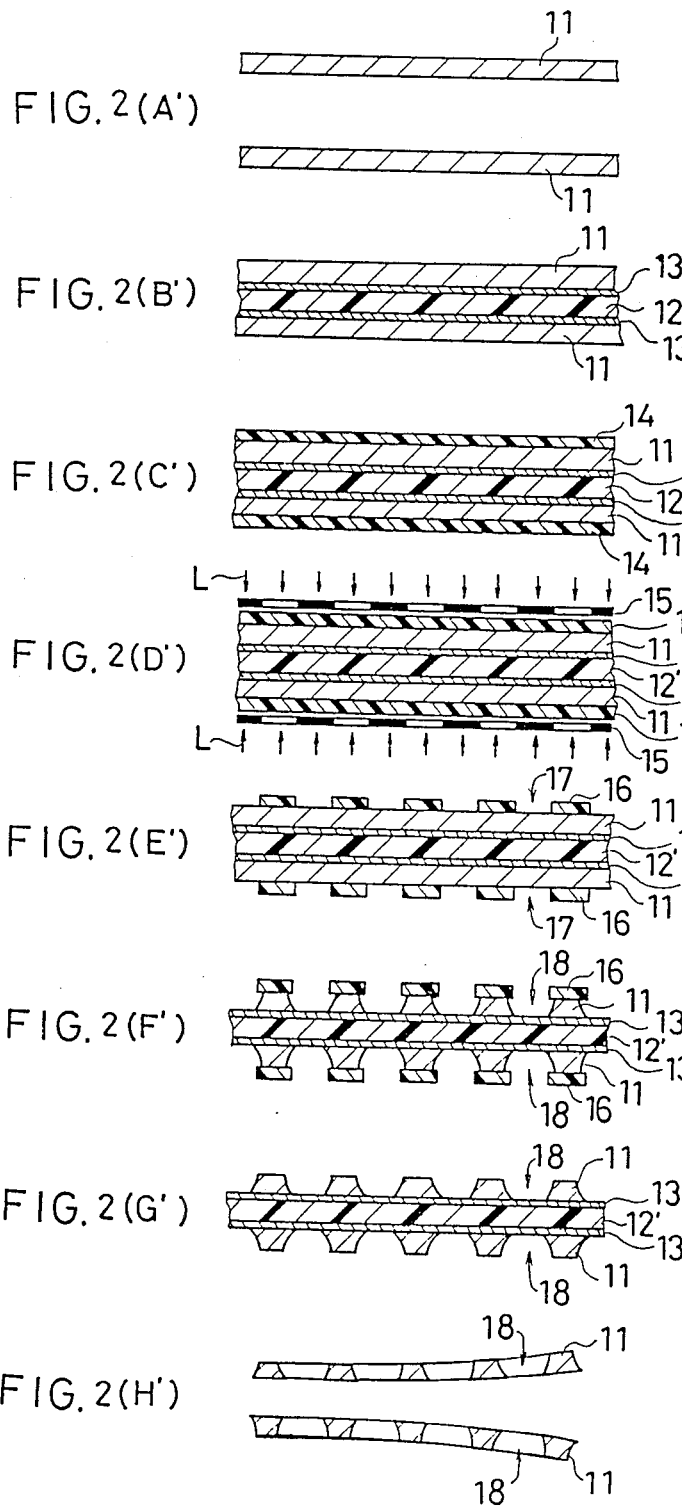

METHOD OF PROCESSING THIN METAL SHEETS BY PHOTOETCHING

BACKGROUND OF THE INVENTION

Field of the Invention

The present invention relates to a method of processing thin metal sheets by utilizing the technique of photoetching. This method is applicable, for example, to micro fabrication of shadow masks for use in television receiving tubes.

Background of the Invention

In the fabrication of shadow masks for use in color picture tubes, the technique of photoetching is utilized to form circular or slit apertures in a shadow mask material for electron beam transmission therethrough. More particularly, a photoresist layer is formed on a surface of an elongate, beltlike metal sheet such as a maleable soft steel sheet or an invar sheet. After the steps of exposure, development and so on to produce a resist, an etching solution is sprayed to the metal sheet surface to dissolve portions of the metal sheet exposed through voids of the resist thereby forming desired apertures in the metal sheet.

Where, as in the case of shadow masks, high precision is required of aperture dimensions, it has been conventional practice to form a resist having pattern images on the metal sheet and spray an etching solution thereto for etching the metal sheet in order to meet such a requirement. The present invention intends to provide an improvement relating to this art.

Where the elongate beltlike metal sheet to be processed is ultra-thin with a thickness of about 0.05 mm, for example, the metal sheet advanced for each processing stage tends to break at its web portions would round a roller. In order to avoid such breakage it is necessary to make the conveying track of the metal sheet in a continuous fabrication line as planar as possible to minimize winding movements of the sheet. This gives rise to the problem of greatly increasing the length of production equipment. even where the metal sheet is in the form of a leaf and its conveying track is planar, there arises the inconvenience of the sheet becoming creased or broken by the impact of a treatment solution if the sheet is ultra-thin.

SUMMARY OF THE INVENTION

The present invention has been made in order to solve the problem of the prior art noted above. The object of the invention, therefore, is to provide a method of etching a thin metal sheet without entailing breakage of the metal sheet during its conveyance. The method advantageously may utilize known production equipment and the steps of forming a resist, etching the metal sheet and removing the resist from the sheet as practiced in the prior art.

The present invention has achieved the above object by utilizing the fact that a thin metal sheet can be apertured with high precision by etching it from only one face thereof. That is to say, where the metal sheet is thin, an etching solution supplied to only one face thereof is effective for etching the metal sheet through its material thickness to the other face thereof, and the resulting apertures have an optimal configuration. The invention is based on this fact, and a supporting sheet is applied to the face of the thin metal sheet to which the etching solution is not supplied, in order to reinforce the metal sheet. The metal sheet thus reinforced is free from breakage occurring during its conveyance.

More particularly, a method of processing a thin metal sheet according to a first aspect of the present invention comprises the steps of fixedly applying a supporting sheet to either surface of the metal sheet; applying a photoresist material to the other surface of the metal sheet to form a photoresist layer thereon; exposing desired pattern images onto the photoresist layer; supplying a developing solution to the photoresist layer to develop the pattern images on the photoresist layer and thereby bare a metal sheet surface having a desired pattern; supplying an etching solution to the metal sheet surface to etch the metal sheet surface thus bared; removing the photoresist layer from the metal sheet; and removing the supporting sheet from the metal sheet.

A method according to a second aspect of the present invention comprises the steps of fixedly applying metal sheets to opposite faces of a supporting sheet; applying a photoresist material to the metal sheets to form a respective photoresist layer on each sheet; exposing desired pattern images into the photoresist layers; supplying a developing solution to the photoresist layers to develop the pattern images on the photoresist layers and thereby bare metal sheet surfaces having desired patterns; supplying an etching solution to the metal sheet surfaces to etch the metal sheet surfaces thus bared; removing the photoresist layers from the metal sheets; and removing the metal sheets from the supporting sheet.

According to the first aspect of the present invention, the metal sheet and the supporting sheet are laminated together into a unit. The resulting composite structure has an increased rigidity. One face of the metal sheet thus reinforced is subjected to the steps of applying a photoresist layer, drying the layer, exposing it to light, developing pattern images and supplying an etching solution. Therefore, the metal sheet, even though thin, is entirely free from a breakage resulting from its vertically winding movements or from the impact of the treatment solutions. Where the metal sheet is sufficiently thin, the metal sheet may be etched only from one face thereof to realize an aperture formed with high precision.

According to the second aspect of the invention, a pair of metal sheets are supported on opposite faces of a supporting sheet to be processed simultaneously with each other. This enables the fabrication of shadow masks or the like to be carried out with twice the productivity of the prior art.

Other features and advantages of the invention will be apparent from the following description.

BRIEF DESCRIPTION OF THE DRAWINGS

FIGS. 2(A)-2(H) are views similar to FIGS. 1(A)-(H) for illustrating a second aspect of the present invention.

DETAILED DESCRIPTION OF THE PREFERRED EMBODIMENTS

Figure 1A:
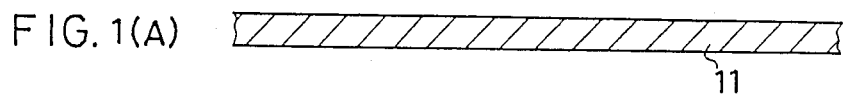
FIGS. 1(A)-1(H) are partial views in vertical section of a metal sheet in various processing stages according to a first aspect of the present invention.
Figure 1B:
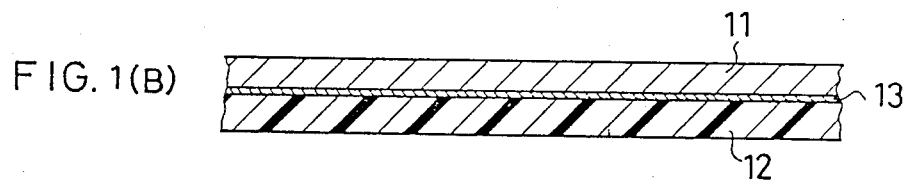
Figure 1C:
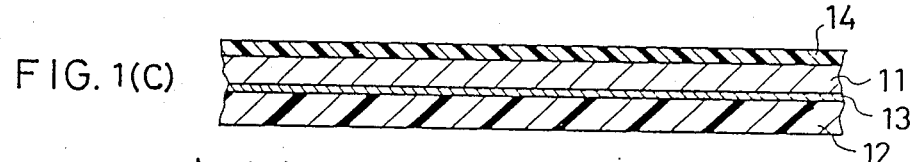
Figure 1D:
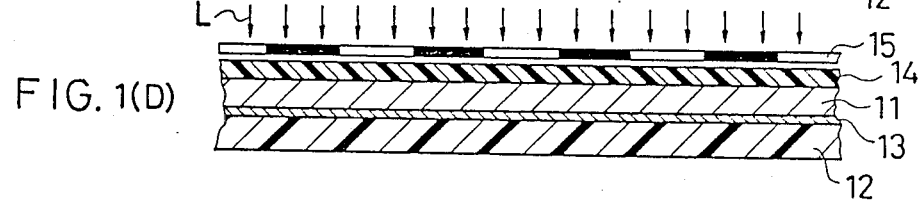
Figure 1E:
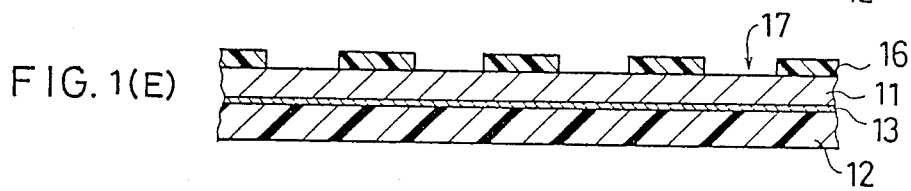
Figure 1F:
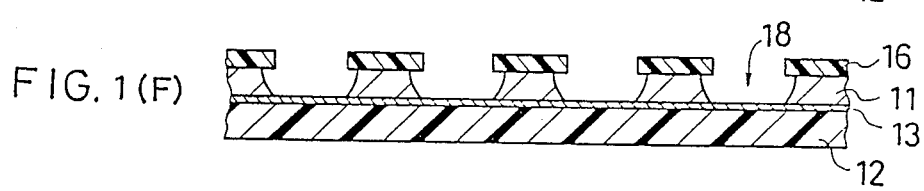
Figure 1G:
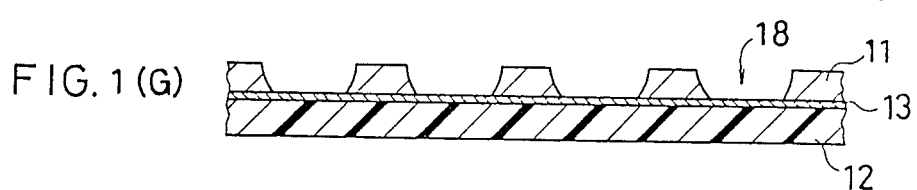
Figure 1H:
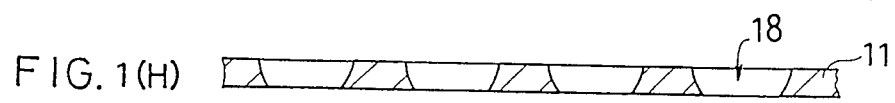

FIGS. 1(A)-(H) are partial views at vertical section of an elongate, beltlike metal sheet in various processing stages, illustrating a photoetching method for processing a metal sheet according to a first aspect of the present invention. First, grease is removed from the metal sheet 11 such as an ultra-thin steel sheet, shown in FIG. 1(A). Then a supporting sheet 12 formed of a synthetic resin and including an adhesive layer 13 is applied to a back face of the metal sheet 11 as shown in FIG. 1(B). Next, a water-soluble or oil-soluble photoresist material 14 is applied to a front face of the metal sheet 11, supported by the supporting sheet 12. The photoresist material is allowed to dry to form layer on the front face of metal sheet 11, as shown in FIG. 1(C). A dry film resist may be employed instead of photoresist material in liquid form. Thereafter, as shown in FIG. 1(D), a separately prepared pattern master 15 is placed tightly on the photoresist layer 14 and light L is cast thereon to expose pattern images in the photoresist layer 14. The images are developed by utilizing a developing solution, which is followed by a hardening treatment, rinsing, dehydration and burning, to produce a resist 16 having a desired image pattern as shown in FIG. 1(E). While in the illustrated embodiment a negative type photoresist material is employed to form the resist, a positive type photoresist material may of course be used instead. Subsequently, an etching solution is sprayed to the surface of metal sheet 11 coated with the resist 16, to dissolve portions of the metal sheet 11 exposed through voids in the resist 16. This results in apertures 18 formed in the metal sheet 11 as shown in FIG. 1(F). In this etching step, the etching solution will not reach to the back face of metal sheet 11 since the metal sheet 11 is tightly backed by the supporting sheet 12. Consequently, the metal sheet 11 is etched to a desired shape with precision. The etching step is followed by a rinsing step, and then the resist 16 is removed from the metal sheet 11 as shown in FIG. 1(G). After a further washing step, finally, the supporting sheet 12 is peeled off the back face of metal sheet 11, which completes a shadow mask comprising the metal sheet 11 with a multiplicity of apertures 18.

FIGS. 2(A')–(H') are partial views in vertical section illustrating a metal sheet processing method according to a second aspect of the present invention. In this processing method, as in the foregoing first method, apertures are formed in the metal sheet through the stages shown in FIGS. 2(A')–(H'). The method according to the second aspect differs from the foregoing method in that two metal sheets are processed simultaneously instead of one. As shown, this second method employs a supporting sheet 12' formed of a synthetic resin material and including respective adhesive layers 13' on opposite faces thereof, and two elongate, beltlike metal sheets 11' respectively attached to the opposite faces of the supporting sheet 12'. Thus, the two metal sheets 12' are opposed to each other across the single supporting sheet 11'. It may be said, therefore, that the method according to the second aspect of the invention is twice as efficient as the method according to the first aspect. In the method illustrated in FIGS. 2(A')–(H'), identical products are fabricated with identical pattern images for the opposite metal sheets 12'. However, the method may utilize different pattern images for the two metal sheets 12'.

An example of actual application of the present invention is now described hereinafter. First, the surfaces of an ultrathin cold-rolled steel sheet having a 25 micrometer thickness is degreased by using trichlen if the surfaces are stained with grease. Thereafter, Sanitect XA-27 (brandname: manufactured by San-ei Kagaku Kogyo K. K., Japan), which are a broad adhesive tape having a 50 micrometer thickness, is applied to the back face of the ultra-thin steel sheet as a supporting sheet. As a supporting sheet having adhesive layers on opposite faces thereof, Duplex Adhesive Tape No. 532 (manufactured by Nitto Denki Kogyo K. K., Japan) is used, and the back faces of a pair of ultra-thin steel sheets are applied, respectively to the opposite faces of this tape. Then, a photosensitizing solution is prepared by mixing 5 parts of a 10 percent casein aqueous solution (casein being a water-soluble high molecular compound) and 1 part of a 3.5 wt/vol percent ammonium bichromate aqueous solution. The photosensitizing solution is applied in a suitable layer thickness to the surface of the steel sheet by using a rod coater device, and is heated to dry at a temperature of 100°–150° C. for five minutes. As a result, a photosensitive or photoresist layer of about 7 micrometer thickness is formed on the ultra-thin steel sheet surface. Thereafter, a pattern master is placed tight on the photosensitive layer and is exposed to a 5 KW metal halide lamp at a 50 cm distance for 20 seconds. After the exposure, pattern images are developed by spraying tap water onto the sensitive layer surface with a 2 kg/cm$^2$ pressure. This removes the portions of the photosensitive layer that have been in tight contact with blackened portions of the master at the exposure stage, thereby forming voids in the photosensitive layer through which the steel sheet surface is bared. Subsequently, a hardening treatment is provided by immersing the steel sheet in a 3 wt/vol percent anhydrous chromic acid for 40 seconds, and then the steel sheet is rinsed with water to wash away the acid remaining thereon. After dehydrating it, the steel sheet is burnt at a temperature of 200°–250° C. for two minutes to increase layer resistance. Then, a 42 percent ferric chloride aqueous solution is sprayed to the steel sheet at a 45° C. temperature and with a 2 kg/cm$^2$ pressure for etching the steel sheet, whereby apertures are formed through the bared portions of the steel sheet. The steel sheet is rinsed after the etching step, which is followed by a layer removing step wherein the steel sheet carrying the resist is immersed for 30 seconds in an aqueous solution of caustic soda mixed with a surfactant and heated to 90° C. After the resist is removed, the steel sheet is rinsed again and, finally, the adhesive tape is rolled up away from the back face of the steel sheet. This completes the fabrication of an ultra-thin steel sheet having a multiplicity of apertures. The supporting sheet should desirably be equal in length to the elongate, beltlike ultrathin metal sheet, but this feature is not essential. A plurality of short supporting layers may be applied to the back face of the elongate, beltlike metal sheet such that the supporting layers are continuously interconnected in a partly overlapping manner, for example, thereby preventing the etching solution from contacting the back face of the metal sheet. In the present invention, therefore, the supporting sheet is not limited with respect to its length. Furthermore, the metal sheet may be in the form of a leaf instead of having an elongated beltlike shape.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A method of patterning a thin metal sheet, comprising the steps of:
   providing a thin metal sheet of less than about 0.5 mm thickness;
   fixedly applying a supporting sheet to one surface of said metal sheet;
   applying a photoresist material to the other surface of said metal sheet to form a photoresist layer therein;
   exposing desired pattern images onto said photoresist layer;
   supplying a developing solution to said photoresist layer to develop said pattern images on said photoresist layer and thereby bare a metal sheet surface having desired pattern images;
   supplying an etching solution to said metal sheet surface to etch said metal sheet surface thus bared;
   removing said photoresist layer from said metal sheet; and
   removing said supporting sheet from said metal sheet by peeling.

2. A method fo patterning thin metal sheets, comprising the steps of:
   providing a pair of thin metal sheets each of less than about 0.05 mm thickness;
   fixedly applying said metal sheets to respective of opposite faces of a supporting sheet;
   applying a photoresist material to said metal sheets to form photoresist layers thereon, respectively;
   exposing desired pattern images onto said photoresist layers;
   supplying a developing solution to said photoresist layers to develop said pattern images on said photoresist layer and thereby bare metal sheet surfaces having desired pattern images;
   supplying an etching solution to said metal sheet surface to etch said metal sheet surface thus bared; and
   removing said metal sheets from said supporting sheet by peeling.

3. A method according to claim 1, wherein the resulting metal sheet constitutes a shadow mask.

4. A method according to claim 2, wherein the resulting pair of metal sheets constitute a pair of shadow masks.

* * * * *